United States Patent
Saitoh et al.

(10) Patent No.: US 7,575,967 B2
(45) Date of Patent: Aug. 18, 2009

(54) SEMICONDUCTOR INTEGRATED CIRCUIT DEVICE AND A MANUFACTURING METHOD FOR THE SAME

(75) Inventors: Naoto Saitoh, Chiba (JP); Yuichiro Kitajima, Chiba (JP)

(73) Assignee: Seiko Instruments Inc. (JP)

( * ) Notice: Subject to any disclaimer, the term of this patent is extended or adjusted under 35 U.S.C. 154(b) by 213 days.

(21) Appl. No.: 11/582,911

(22) Filed: Oct. 18, 2006

(65) Prior Publication Data

US 2007/0085137 A1   Apr. 19, 2007

(30) Foreign Application Priority Data

| Oct. 19, 2005 | (JP) | ............................... 2005-304002 |
| Nov. 16, 2005 | (JP) | ............................... 2005-331581 |
| Oct. 17, 2006 | (JP) | ............................... 2006-282725 |

(51) Int. Cl.
    H01L 29/72 (2006.01)
(52) U.S. Cl. ...................... 438/197; 438/233; 438/265; 438/759
(58) Field of Classification Search ................. 438/197, 438/233, 265, 759
    See application file for complete search history.

(56) References Cited

U.S. PATENT DOCUMENTS

| 6,627,502 B1 * | 9/2003 | Cho ........................... 438/265 |
| 2004/0087075 A1 * | 5/2004 | Wang et al. ................. 438/199 |
| 2005/0179098 A1 * | 8/2005 | Chan et al. .................. 257/412 |

* cited by examiner

*Primary Examiner*—Edward Wojciechowicz
(74) *Attorney, Agent, or Firm*—Adams & Wilks

(57) ABSTRACT

In a manufacturing method for a semiconductor device, a first impurity diffusion layer for a low impurity concentration drain of a second conductivity type is formed within a semiconductor layer of a first conductivity type, and a second impurity diffusion layer for a high impurity concentration drain of the second conductivity type is formed adjacent to the first impurity diffusion layer, with the second impurity diffusion layer having a higher impurity concentration than the first impurity diffusion layer. An interlayer insulating film is formed on the semiconductor substrate layer. A drain extension region having a high thermal conductivity is formed on a surface of the first impurity diffusion layer. A contact hole is formed through the interlayer insulating film and up to the second impurity diffusion layer. A wiring metal layer is then deposited into the contact hole to form therein a drain electrode that is electrically connected to the second impurity diffusion layer and that is disposed apart from and not in contact with the drain extension region.

11 Claims, 9 Drawing Sheets

PRIOR ART

FIG. 8A

PRIOR ART

FIG. 8B

PRIOR ART

FIG. 8C

PRIOR ART

FIG. 9A

PRIOR ART

FIG. 9B

PRIOR ART

FIG. 9C

PRIOR ART

FIG. 9D

PRIOR ART

FIG. 9E

SEMICONDUCTOR INTEGRATED CIRCUIT DEVICE AND A MANUFACTURING METHOD FOR THE SAME

BACKGROUND OF THE INVENTION

1. Field of the Invention

The present invention relates to a semiconductor integrated circuit device and a manufacturing method for the same in which low voltage operation with low power consumption and high driving capacity is required. In particular, the present invention relates to a manufacturing method for a power management semiconductor device such as a voltage detector (hereinafter, referred to as VD), a voltage regulator (hereinafter, referred to as VR), or a switching regulator (hereinafter, referred to as SWR).

2. Description of the Related Art

Figure 8A:
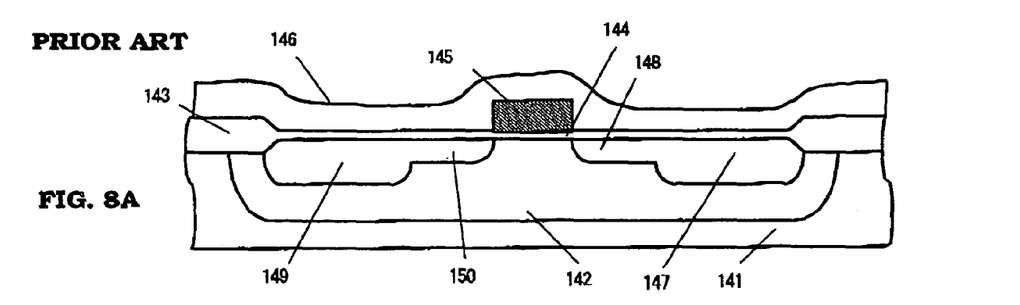
FIGS. 8A to 8C are schematic cross-sectional diagrams showing process steps of a manufacturing method for a semiconductor device in sequence according to a conventional technology.
Figure 8B:
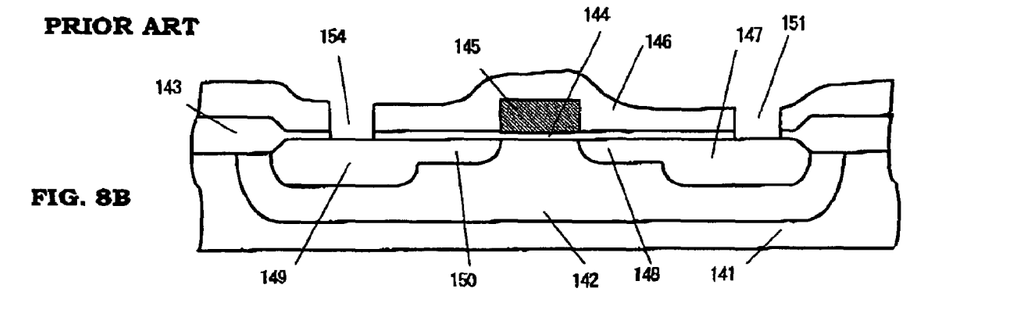
Figure 8C:
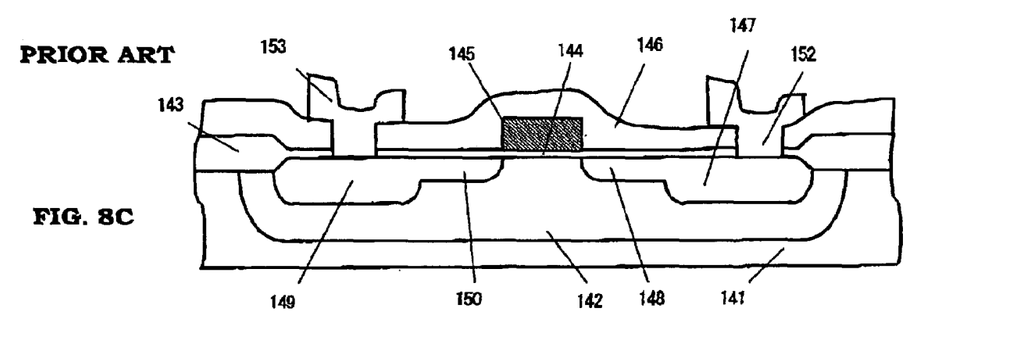

A conventional technology is explained with reference to FIGS. 8A to 8C. FIGS. 8A to 8C are schematic cross-sectional views showing sequential process steps of a manufacturing method for a semiconductor device according to a conventional technology. An NMOS transistor having an offset type LDD structure is shown as an example.

AS shown in FIG. 8A, a P-type semiconductor substrate 141, for example, doped with boron at an impurity concentration to attain a resistivity of 20 Ωcm to 30 Ωcm, is subjected to, for example, ion implantation of boron at a dose of $1\times10^{11}$ atoms/cm$^2$ to $1\times10^{13}$ atoms/cm$^2$ and to annealing at 1,000° C. to 1,200° C. for several hours to ten-odd hours, to form a diffusion layer, or a P-type well 142. Then, a field insulating film 143, for example, a thermal oxide film with a thickness of several thousands Å to 1 μm, is formed on the substrate by a LOCOS method, and a part of the field insulating film 143 corresponding to a region for forming a MOS transistor is removed, to thereby form a gate insulating film 144, for example, a thermal oxide film with a thickness of 10 nm to 100 nm. The P-type semiconductor substrate 141 and P-type well 142 are subjected to ion plantation before or after the formation of the gate insulating film 144 to thereby control the impurity concentrations thereof.

Next, also in FIG. 8A, polycrystalline silicon is deposited on the gate insulating film 144, to which impurities are introduced through predeposition or ion implantation, and the polycrystalline silicon is subjected to patterning, to thereby obtain a polycrystalline silicon gate 145 which serves as a gate electrode.

Subsequently, for example, arsenic (As) ion is implanted at a dose of, preferably, $1\times10^{14}$ to $1\times10^{16}$ atoms/cm$^2$ so as to reduce a sheet resistance to form a high impurity concentration drain region 147 and a high impurity concentration source region 149 at a certain distance from the polycrystalline silicon gate 145. After that, for example, phosphorus ions are implanted at a dose of, preferably, $1\times10^{12}$ to $1\times10^{14}$ atoms/cm$^2$, to form a low impurity concentration drain region 148 and a low impurity concentration source region 150 in a self-alignment manner by using the polycrystalline silicon gate 145 as a mask.

Next, still in FIG. 8A, an interlayer insulating film 146 having a film thickness in the range of 200 nm to 800 nm is deposited.

Next, as shown in FIG. 8B, contact holes 150, 151 are formed for connecting wiring to each of the high impurity concentration source region 149 and the high impurity concentration drain region 147. Subsequently, metal wiring is formed through sputtering or the like and subjected to patterning; drain electrode metal 152 is connected to a surface of the high impurity concentration drain region 147 through the contact hole 150. (See, for example, Kazuo Maeda, "Semiconductor Process for Beginners" (Japanese), Kogyo Chosakai Publishing, Inc., Dec. 10, 2000, p. 30.)

FIGS. 9A to 9E are schematic cross-sectional diagrams showing sequential process steps of a manufacturing method for a high-breakdown voltage semiconductor device according to another conventional technology. A part of the structure from a gate to a drain of a high voltage operating MOS transistor having a thick oxide film at a drain edge is shown as an example.

Figure 9A:
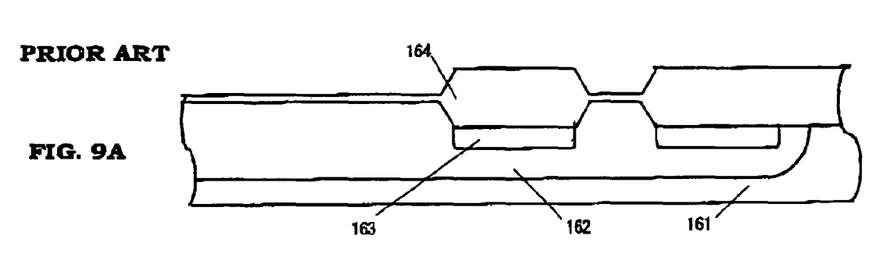
FIGS. 9A to 9E are schematic cross-sectional diagrams showing process steps of a manufacturing method for a high-breakdown voltage semiconductor device in sequence according to another conventional technology.

In FIG. 9A, a P-type semiconductor substrate 161, for example, doped by boron at an impurity concentration to attain a resistivity of 20 Ωcm to 30 Ωcm, is subjected to, for example, ion implantation of boron at a dose of $1\times10^{11}$ atoms/cm$^2$ to $1\times10^{13}$ atoms/cm$^2$ and to annealing at 1,000° C. to 1,200° C. for several hours to ten-odd hours, to form a diffusion layer, or a F-type well 162. Here, an explanation is given on process steps for forming a F-type well on a P-type semiconductor substrate, while a P-type well may also be formed on an N-type semiconductor substrate in a similar manner.

Then, a thick oxide film is formed on the substrate by a LOCOS method. Following the deposition and patterning of a silicon nitride film (not shown), impurities, for example, phosphorus ions are implanted at a dose of, preferably, $1\times10^{11}$ to $1\times10^{13}$ atoms/cm$^2$, to form a thick oxide film, for example, with a thickness of 0.2 μm to 2 μm. Through these process steps, a low impurity concentration drain region 163 is formed below the thick oxide film 164.

Figure 9B:
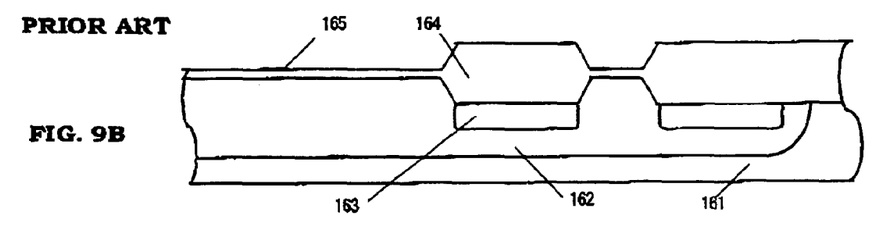

Next, as shown in FIG. 9B, a thin oxide film is removed, followed by a formation of a gate insulating film 165.

Figure 9C:
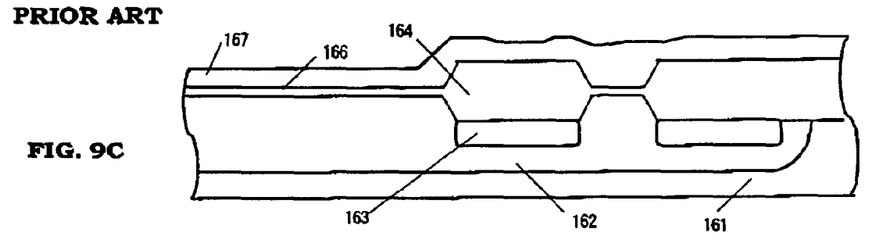

Subsequently, as shown in FIG. 9C, polycrystalline silicon 167 is deposited, to which impurities are introduced through predeposition or ion implantation.

Figure 9D:
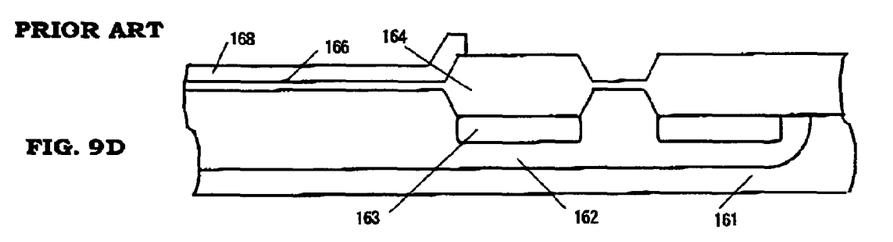

Then, as shown in FIG. 9D, the polycrystalline silicon 167 is subjected to patterning, to thereby obtain a polycrystalline silicon gate 168 which serves as a gate electrode.

Figure 9E:
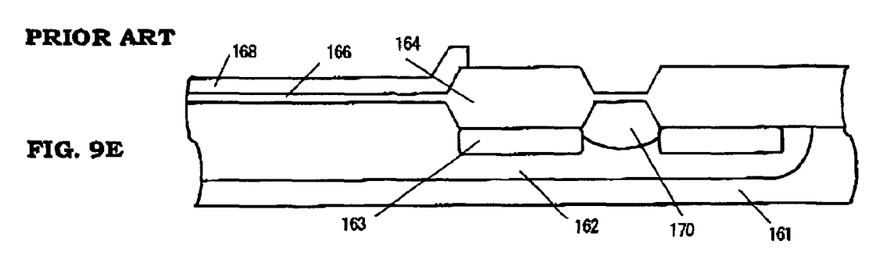

Next, as shown in FIG. 9E, in order to form a high impurity concentration source region (not shown) and a high impurity concentration drain regions 170, for example, arsenic (As) ions are implanted at a dose of, preferably, $1\times10^{14}$ to $1\times10^{16}$ atoms/cm$^2$ so as to reduce a sheet resistance.

According to the semiconductor device manufactured according to the conventional methods described above, formation of a drain region at a lower concentration of impurity for the purpose of ensuring high junction breakdown voltage, surface breakdown voltage, snap-back voltage, or a low impact ionization rate, results in a reduction in an ESD immunity, which may eventually lead to a case where the ESD immunity falls below standards. There also occurs a phenomenon in which a large amount of drain current causes a self-heating in the low impurity concentration region, particularly in a portion having a high resistance, causing a current concentration thereto, which leads to destruction of the element.

That is, inconsistency between important characteristics of a transistor and the ESD immunity sometimes comes out, and leads to a problem in that characteristics and standards cannot be satisfied together without increase in transistor size to face an increase in cost along with the increase in chip area.

Also, wiring metal in the contact region in general is not excellent in its coverage, which is about 20% of the wiring metal thickness in a flat area. Such low coverage is a main reason for limiting current density, which accordingly makes it difficult to pass a large amount of current without increase in a contact area.

SUMMARY OF THE INVENTION

The present invention has been made in view of the above-mentioned problems, and has an object to provide a transistor of a small area, resistant to a thermal destruction while satisfying a sufficient ESD immunity, whose manufacturing method can provide a semiconductor device of high accuracy with low parasitic resistance in low cost.

In order to solve the above-mentioned problems, the present invention provides the methods as follows:

(1) A manufacturing method for a semiconductor device, comprising the steps of:

forming a gate insulating film on a semiconductor substrate region of a first conductivity type;

forming a gate electrode by depositing a first polycrystalline silicon on the gate insulating film, introducing impurities thereto, and patterning the first polycrystalline silicon;

forming a first impurity diffusion layer for a low impurity concentration drain of a second conductivity type within the semiconductor region of the first conductivity type;

forming a second impurity diffusion layer for a high impurity concentration drain of the second conductivity type having a higher impurity concentration than the first impurity diffusion layer adjacent to the first impurity diffusion layer;

forming an extension region having a higher thermal conductivity than a silicon insulating film on a surface of the first impurity diffusion layer in an opposite direction to the semiconductor substrate region;

forming a contact hole for establishing electrical connections for the second impurity diffusion layer; and depositing wiring metal and electrically connecting the wiring metal to the second impurity diffusion layer through the contact hole;

(2) The manufacturing method for a semiconductor device, including the steps of:

forming the gate insulating film on the semiconductor substrate layer of the first conductivity type;

forming a gate electrode on the gate insulating film;

introducing impurities to the gate electrode;

forming an impurity diffusion layer of the second conductivity type within the semiconductor layer of the first conductivity type, the impurity diffusion layer having at least two regions at different impurity concentrations;

forming an interlayer insulating film on the semiconductor substrate layer of the first conductivity type;

removing a part of the interlayer insulating film deposited on the impurity diffusion layer of the second conductivity type;

forming polycrystalline silicon on a region where the part of the interlayer insulating film deposited on the impurity diffusion layer of the second conductivity type is removed, and connecting a surface of the impurity diffusion layer of the second conductivity type to the polycrystalline silicon;

introducing impurities of the second conductivity type to the polycrystalline silicon;

forming a contact hole for connecting the impurity diffusion layer of the second conductivity type to wiring metal; and depositing the wiring metal and electrically connecting the wiring metal to the impurity diffusion layer of the second conductivity type through the contact hole, while connecting the impurity diffusion layer of the second conductivity type to the polycrystalline silicone;

(3) The manufacturing method for a semiconductor, device according to item (2), in which the semiconductor substrate layer of the first conductivity type is formed on a semiconductor substrate of the second conductivity type;

(4) The manufacturing method for a semiconductor device according to item (2), in which the polycrystalline silicon has a film thickness within a range of 50 nm to 800 nm;

(5) The manufacturing method for a semiconductor device according to item (2), in which the step of introducing impurities to the polycrystalline silicon employs an ion implantation method;

(6) The manufacturing method for a semiconductor device according to item (2), further including the step of electrically connecting the wiring metal to the polycrystalline silicon, simultaneously with the step of depositing the wiring metal and electrically connecting the wiring metal to the impurity diffusion layer of the second conductivity type through the contact hole;

(7) The manufacturing method for a semiconductor device according to item (2), further including the steps of:

forming polycrystalline silicon and introducing impurities of the second conductivity type to the polycrystalline silicon;

forming an insulating film on the polycrystalline silicon;

forming a contact hole for establishing electrical connections for the impurity diffusion layer of the second conductivity type; and depositing wiring metal, the above steps being performed in the stated order;

(8) The manufacturing method for a semiconductor device, including the steps of:

forming a gate insulating film on a semiconductor substrate layer of the first conductivity type;

depositing polycrystalline silicon on the gate insulating film and introducing impurities thereto;

depositing a silicon nitride film on the polycrystalline silicon and subjecting the silicon nitride film to patterning;

forming a gate electrode by subjecting the polycrystalline silicon to patterning by using the silicon nitride film as a mask;

forming an impurity diffusion layer of the second conductivity type within the semiconductor layer of the first conductivity type, the impurity diffusion layer having at least two regions at different impurity concentrations;

forming a side spacer on a side wall of the gate electrode, the side spacer being formed of the silicon nitride film;

forming a side spacer on the gate electrode and on the side spacer of the silicon nitride film, the side spacer being formed of the polycrystalline silicon;

forming an interlayer insulating film on the semiconductor substrate layer of the first conductivity type;

forming contact holes by removing: a part of the interlayer insulating film on the side spacer of polycrystalline silicon; and a part of the interlayer insulating film on the impurity diffusion layer of the second conductivity type; and depositing wiring metal and electrically connecting the side spacer of the polycrystalline silicon and the impurity diffusion layer of the second conductivity type to the wiring metal through the contact holes;

(9) The manufacturing method for a semiconductor device according to item (8), further including the step of electrically connecting the side spacer of the polycrystalline silicon to the wiring metal, simultaneously with the step of depositing the wiring metal and electrically connecting the wiring metal to the impurity diffusion layer of the second conductivity type through the contact holes;

(10) The manufacturing method for a semiconductor device according to item (8), in which the semiconductor substrate layer of the first conductivity type is formed on a semiconductor substrate of the second conductivity type;

(11) The manufacturing method for a semiconductor device according to item (8), in which the side spacer of the silicon nitride film has a width within a range of 0.1 µm to 0.5 µm;

(12) The manufacturing method for a semiconductor device according to item (8), in which the side spacer of the polycrystalline silicon has a width within a range of 0.2 µm to 1.0 µm;

(13) The manufacturing method for a semiconductor device according to item (8), in which the step of introducing impurities to the side spacer of the polycrystalline silicon employs an ion implantation method;

(14) The manufacturing method for a semiconductor device, including the steps of:

forming a first impurity diffusion layer of the second conductivity type on a part of the semiconductor substrate layer of the first conductivity type;

forming a silicon oxide film on the first impurity diffusion layer of the second conductivity type;

forming a gate insulating film on a region where the silicon oxide film is not formed;

exposing a silicon surface of the first impurity diffusion layer of the second conductivity type by removing a part of the silicon oxide film on the first impurity diffusion layer of the second conductivity type;

depositing polycrystalline silicon to regions where a part of the gate insulating film and a part of an insulating film on the first impurity diffusion layer of the second conductivity type are removed, and connecting a silicon surface of the first impurity diffusion layer of the second conductivity type to the polycrystalline silicon;

introducing impurities of the second conductivity type to the polycrystalline silicon;

subjecting the polycrystalline silicon to patterning to separate a gate electrode on the gate insulating film and an expansion drain region on the first impurity diffusion layer of the second conductivity type from each other;

forming a second impurity diffusion layer of the second conductivity type adjacent to the first impurity diffusion layer of the second conductivity type;

forming a contact hole for establishing electrical connections for the second impurity diffusion layer of the second conductivity type; and depositing wiring metal and electrically connecting the wiring metal to the second impurity diffusion layer of the second conductivity type through the contact hole;

(15) The manufacturing method for a semiconductor device according to item (14), in which the insulating film on the first impurity diffusion layer of the second conductivity type includes a silicon oxide film having a film thickness of 100 nm to 1,200 nm; and (16) The manufacturing method for a semiconductor device according to item (14), further including the step of connecting the second polycrystalline silicon to the wiring metal, simultaneously with the step of electrically connecting the impurity diffusion layer of the second conductivity type to the wiring metal through the contact hole.

As described above, according to the manufacturing method for a power management semiconductor device or an analog semiconductor device both including a CMOS transistor, disposition and connection of an extension region on and above a part of a silicon surface of a low impurity concentration drain region in a MOS transistor helps to reduce the drain resistance during normal circuit operation, and to advance thermal diffusion in the low impurity concentration drain region during high current operation or at the time of an ESD surge input, preventing thermal destruction of silicon by suppressing the temperature rising, thereby improving an ESD immunity and a destruction resistance of the element. Accordingly, increase in the freedom in setting the concentration for the low impurity concentration drain region leads to an easy implementation of transistor characteristics as desired.

DETAILED DESCRIPTION OF THE PREFERRED EMBODIMENTS

Hereinafter, embodiments of the present invention are described with reference to the accompanying drawings.

FIGS. 1A to 1D are schematic cross-sectional diagrams showing sequential process steps according to the first embodiment of a manufacturing method for a semiconductor device of the present invention.

Figure 1A:
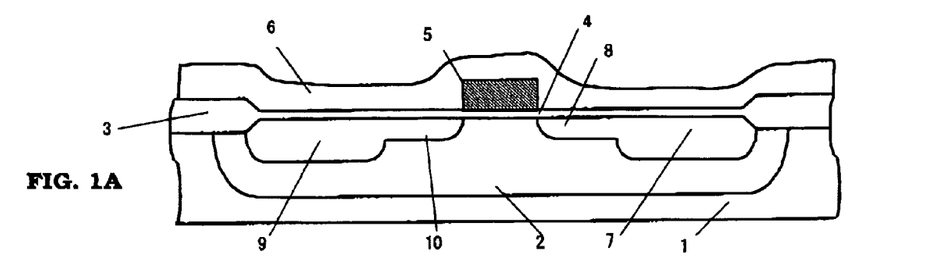
FIGS. 1A to 1D are schematic cross-sectional diagrams showing process steps of a manufacturing method for a semiconductor device in sequence according to a first embodiment of the present invention.

In FIG. 1A, a P-type semiconductor substrate 1, for example, doped with boron at an impurity concentration to attain a resistivity of 20 Ωcm to 30 Ωcm, is subjected to, for example, ion implantation of boron at a dose of $1 \times 10^{11}$ atoms/cm$^2$ to $1 \times 10^{13}$ atoms/cm$^2$ and to annealing at 1,000 to 1,200° C. for several hours to ten-odd hours, to form a diffusion layer or a P-type well 2. Here, an explanation is given to process steps for forming a P-type well on a P-type semiconductor substrate, while a P-type well may also be formed on an N-type semiconductor substrate in a similar manner. The substrate can have either conductivity type, which is irrelevant to the gist of the present invention.

Then, a field insulating film 3, for example, a thermal oxide film with a thickness of several thousands Å to 1 μm, is formed on the substrate by a LOCOS method, and a part of the insulating film corresponding to a region for forming a MOS transistor is removed, to thereby form a gate insulating film 4, for example, a thermal oxide film with a thickness of 10 nm to 100 nm. The P-type semiconductor substrate 1 and P-type well 2 are subjected to ion plantation before or after the formation of the gate insulating film 4, to thereby control the impurity concentrations thereof. Subsequently, polycrystalline silicon is deposited on the gate insulating film 4, to which impurities are introduced through predeposition or ion implantation, and the polycrystalline silicon is subjected to patterning, to thereby obtain a polycrystalline silicon gate 5 which serves as a gate electrode.

Subsequently, for example, arsenic (As) ions are implanted at a dose of, preferably, $1\times10^{14}$ to $1\times10^{16}$ atoms/$cm^2$ so as to reduce a sheet resistance, to form a high impurity concentration drain region 7 and a high impurity concentration source region 9 at a certain distance from the polycrystalline silicon gate 5. After that, for example, phosphorus ions are implanted at a dose of, preferably, $1\times10^{12}$ to $1\times10^{14}$ atoms/$cm^2$, to form a low impurity concentration drain region 8 and a low impurity concentration source region 10 in a self-alignment manner by using the polycrystalline silicon gate 5 as a mask.

Next, an interlayer insulating film 6 is deposited to a film with a thickness in the range of 200 nm to 800 nm.

Figure 1B:
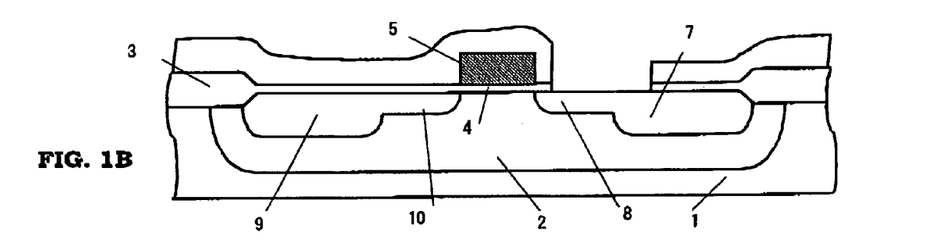

In FIG. 1B, the interlayer insulating film 6 is partially removed in a region on the low impurity concentration drain region 8 and on the high impurity concentration drain region 7, at a certain distance from the polycrystalline silicon gate 5, to expose a silicon surface on the low impurity concentration drain region 8 and on the high impurity concentration drain region 7.

Figure 1C:
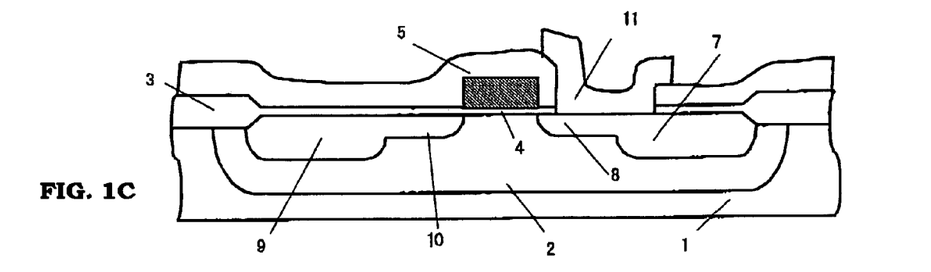

In FIG. 1C, on the silicon surface exposed on the low impurity concentration drain region 8 and on the high impurity concentration drain region 7 of FIG. 1B, polycrystalline silicon is deposited, to which impurities are introduced, and the polycrystalline silicon is subjected to patterning, to thereby obtain a polycrystalline silicon drain 11. An example of the impurity introduction includes ion plantation of phosphorus at a dose of, preferably, $1\times10^{14}$ to $1\times10^{16}$ atoms/$cm^2$.

Figure 1D:
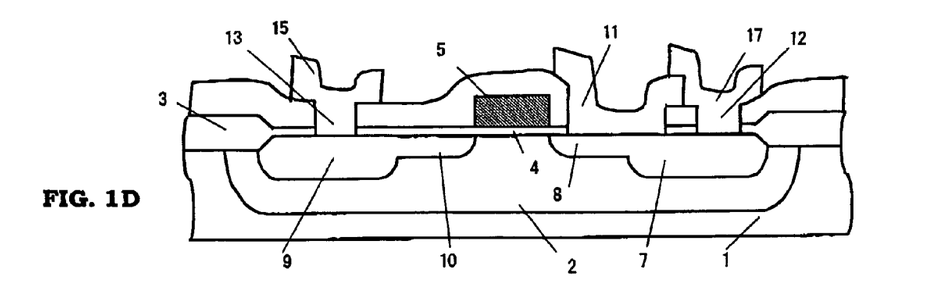

Next, in FIG. 1D, contact holes (12, 13) are formed for connecting wiring to each of the source region and the drain region. Subsequently, wiring metal is formed by sputtering and subjected to patterning, and the wiring metal and a drain surface is connected through the contact hole, while at the same time the polycrystalline silicon drain 11 on the low impurity concentration drain region 8 is connected to a drain electrode metal 17. Likewise the low impurity concentration source region 9 is connected to a source electrode metal 15.

It should be noted that the polycrystalline silicon drain 11 and the drain electrode metal 17 are not necessarily connected to each other. The decision as to whether or not to connect the polycrystalline silicon drain 11 to the drain electrode metal 17 can be made by considering ESD immunity, transistor breakdown voltage, amount of drain current, etc.

FIGS. 2A to 2D are schematic cross-sectional diagrams showing sequential process steps according to the second embodiment of a manufacturing method for a semiconductor device of the present invention.

Figure 2A:
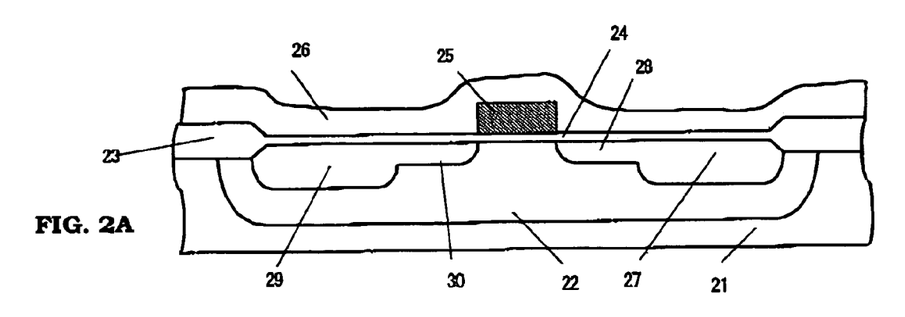
FIGS. 2A to 2D are schematic cross-sectional diagrams showing process steps of a manufacturing method for a semiconductor device in sequence according to a second embodiment of the present invention.

In FIG. 2A, a P-type semiconductor substrate 21, for example, doped with boron at an impurity concentration to attain a resistivity of 20 Ωcm to 30 Ωm, is subjected to, for example, ion implantation of boron at a dose of $1\times10^{11}$ atoms/$cm^2$ to $1\times10^{13}$ atoms/$cm^2$ and to annealing at 1,000 to 1,200° C. for several hours to ten-odd hours, to form a diffusion layer or a F-type well 22. Here, an explanation is given on process steps for forming a P-type well on a P-type semiconductor substrate, while a F-type well may also be formed on an N-type semiconductor substrate in a similar manner. The substrate can have either conductivity type, which is irrelevant to the gist of the present invention.

Then, a field insulating film 23, for example, a thermal oxide film with a thickness of several thousands Å to 1 μm, is formed on the substrate by a LOCOS method, and a part of the insulating film corresponding to a region for forming a MOS transistor is removed, to thereby form a gate insulating film 24, for example, a thermal oxide film with a thickness of 10 nm to 100 nm. The P-type semiconductor substrate 21 and P-type well 22 are subjected to ion implantation before or after the formation of the gate insulating film 24 to thereby control the impurity concentrations thereof. Subsequently, polycrystalline silicon is deposited on the gate insulating film 24, to which impurities are introduced through predeposition or ion implantation, and the polycrystalline silicon is subjected to patterning, to thereby obtain a polycrystalline silicon gate 25 which serves as a gate electrode.

Subsequently, for example, arsenic (As) ions are implanted at a dose of, preferably, $1\times10^{14}$ to $1\times10^{16}$ atoms/$cm^2$ so as to reduce a sheet resistance, to form a high impurity concentration drain region 27 and a high impurity concentration source region 29 at a certain distance from the polycrystalline silicon gate 25. After that, for example, phosphorus ions are implanted at a dose of, preferably, $1\times10^{12}$ to $1\times10^{14}$ atoms/$cm^2$, to form a low impurity concentration drain region 28 and a low impurity concentration source region 30 in a self-alignment manner by using the polycrystalline silicon gate 25 as a mask.

Next, an interlayer insulating film 26 is deposited to a film thickness in the range of 200 nm to 800 nm.

Figure 2B:
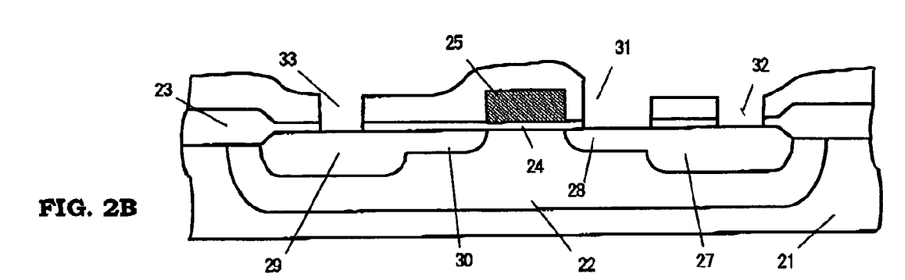

In FIG. 2B, the interlayer insulating film 26 is partially removed in regions at certain distances from the polycrystalline silicon gate 25 on the low impurity concentration drain region 28, on the high impurity concentration drain region 27 and on the high impurity concentration source region 29, and a low impurity concentration drain region contact hole 31, a high impurity concentration drain region contact hole 32 and a high impurity concentration source contact hole 33 are formed on the low impurity concentration drain region 28, on the high impurity concentration drain region 27 and on the high impurity concentration source region 29, respectively, to thereby expose silicon surface thereof.

Figure 2C:
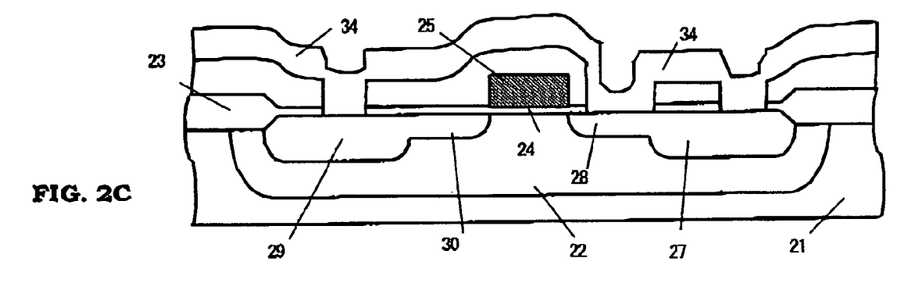
Figure 2D:
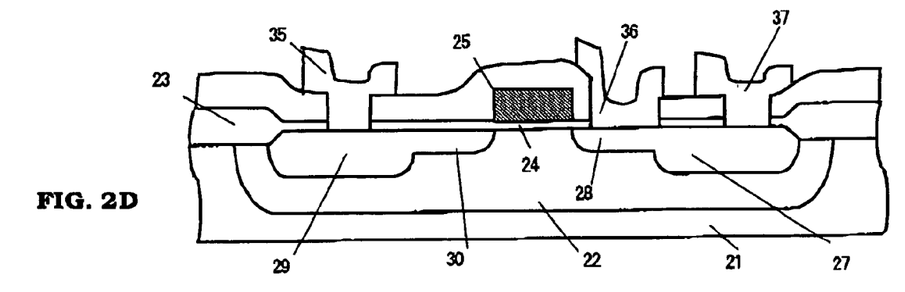

In FIG. 2C, a wiring metal layer 34 is deposited over an entire surface of the substrate through sputtering to a desired thickness Next, in FIG. 2D, the wiring metal layer 34 is subjected to patterning, to thereby obtain a source electrode 35, a high impurity concentration drain electrode 37, and a low concentration drain region metal layer 36.

FIGS. 3A to 3D are schematic cross-sectional diagrams showing sequential process steps according to a third embodiment of a manufacturing method for a semiconductor device of the present invention.

Figure 3A:
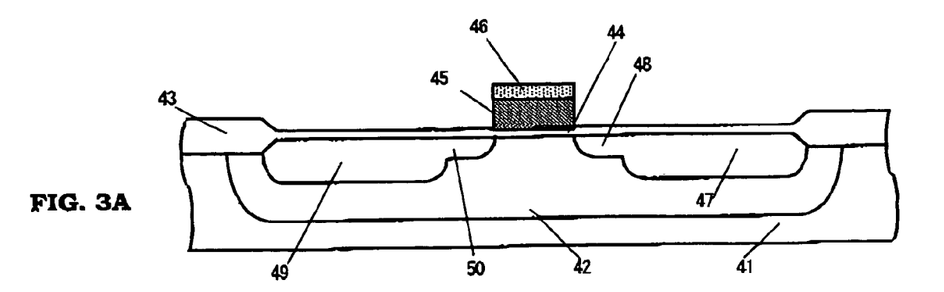
FIGS. 3A to 3D are schematic cross-sectional diagrams showing process steps of a manufacturing method for a semiconductor device in sequence according to a third embodiment of the present invention.

As shown in FIG. 3A, a P-type semiconductor substrate 41, for example, doped with boron at an impurity concentration to attain a resistivity of 20 Ωcm to 30 Ωcm, is subjected to, for example, ion implantation of boron at a dose of $1\times10^{11}$ atoms/$cm^2$ to $1\times10^{13}$ atoms/$cm^2$ and to annealing at 1,000 to 1,200° C. for several hours to ten-odd hours, to form a diffusion layer or a P-type well 42. Here, an explanation is given on process steps for forming a P-type well on a P-type semiconductor substrate, while a P-type well may also be formed on an N-type semiconductor substrate in a similar manner. The substrate can have either conductivity type, which is irrelevant to the gist of the present invention.

Then, a field insulating film 43, for example, a thermal oxide film with a thickness of several thousands Å to 1 μm, is formed on the substrate by a LOCOS method, and a part of the insulating film corresponding to a region for forming a MOS transistor is removed, to thereby form a gate insulating film 44, for example, a thermal oxide film with a thickness of 5 nm to 100 nm. The P-type semiconductor substrate 41 and P-type well 42 are subjected to ion plantation before or after the formation of the gate insulating film 44, to thereby control the impurity concentrations thereof. Subsequently, polycrystalline silicon is deposited on the gate insulating film 44, to which impurities are introduced through predeposition or ion implantation. Further, a silicon nitride film is deposited and subjected to patterning, to thereby obtain a silicon nitride film 46 for a gate electrode. Here, the polycrystalline silicon preferably has a film thickness of 100 nm to 500 nm, and the silicon nitride film 46 preferably has a thickness of 30 nm to 100 nm. Also, a silicide layer such as WSi may be deposited between the polycrystalline silicon film and the silicon nitride film 46.

After that, the polycrystalline silicon is subjected to patterning by using the silicon nitride film 46 for the gate electrode as a mask, to thereby obtain a polycrystalline silicon gate 45 which serves as a gate electrode.

Subsequently, for example, arsenic (As) ions are implanted at a dose of, preferably, $1 \times 10^{14}$ to $1 \times 10^{16}$ atoms/cm$^2$ so as to reduce a sheet resistance, to form a high impurity concentration drain region 47 and a high impurity concentration source region 49 each at a certain distance from the polycrystalline silicon gate 45. After that, for example, phosphorus ions are implanted at a dose of, preferably, $1 \times 10^{12}$ to $1 \times 10^{14}$ atoms/cm$^2$, to form a low impurity concentration drain region 48 and a low impurity concentration source region 50 in a self alignment manner by using the polycrystalline silicon gate 45 and the silicon nitride film 46 together as a mask.

Figure 3B:
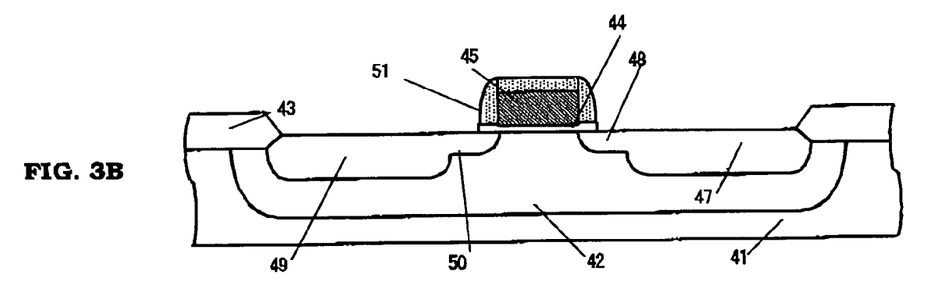

As shown in FIG. 3B, a silicon nitride film is deposited again, and subjected to anisotropic etching, to thereby form a silicon nitride film side spacer 51. After that, the oxide film on each of the source and the drain is removed through wet etching. The film thickness of each of the polycrystalline silicon gate 45, the silicon nitride film 46 on the gate electrode, and the silicon nitride film constituting the side spacer may be controlled, to thereby change the silicon nitride film side spacer 51 to have various widths in a lateral direction. The silicon nitride film preferably has a film thickness of 100 nm to 500 nm, with a width of 0.1 μm to 0.5 μm in a lateral direction. There may be a case where simultaneous removal of the oxide film on each of the drain and the source occurs with the silicon nitride film depending on the etching condition. In such case, there is no need to perform wet etching afterwards.

Figure 3C:
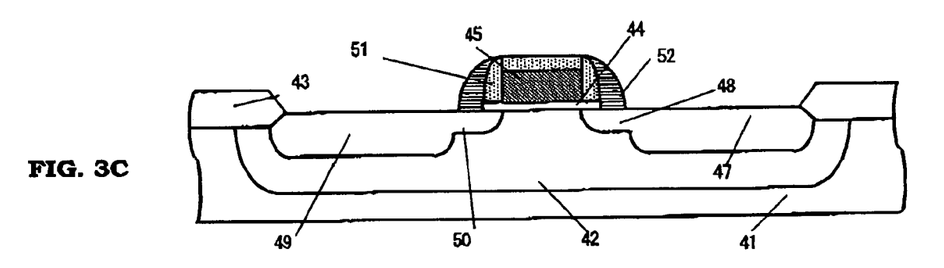

Next, as shown in FIG. 3C, the second polycrystalline silicon is deposited on the silicon surface of the low impurity concentration drain region 48 and the high impurity concentration drain region 47, which have been exposed in FIG. 3B, and impurities are introduced through predeposition or ion implantation, and then the second polycrystalline silicon is subjected an isotropic etching, to thereby form a polycrystalline silicon side spacer 52. The amount of the impurity to be introduced may be varied, to thereby control the ESD immunity and the drain resistance.

At this time, a part of the silicon surface of the high impurity concentration source region 49 and the low impurity concentration source region 50 and a part of the silicon surface of the high impurity concentration drain region 47 and of the low impurity concentration drain region 48 each connect to the polycrystalline silicon side spacer 52 respectively. The film thickness of each of the polycrystalline silicon gate 45, the silicon nitride film 46 for the gate electrode, and the silicon nitride film constituting the side spacer 51, and the deposition film thickness of the polycrystalline silicon constituting the side spacer 52 may be controlled, to thereby change the polycrystalline silicon side spacer 52 to have various lengths in a lateral direction. The polycrystalline silicon side spacer 52 preferably has a length of 0.2 μm to 1.0 μm in a lateral direction. In this way, it is possible to control a contact area on the silicon surface on the low impurity concentration drain region 48 and on the high impurity concentration drain region 47 which comes in contact with the polycrystalline silicon side spacer 52.

Conductivity type of the impurity introduces into the second polycrystalline silicon is the same as those of the source and the drain In this embodiment, for example, phosphorus is ion implanted at a dose of, preferably, $1 \times 10^{14}$ to $1 \times 10^{16}$ atoms/cm$^2$.

Figure 3D:
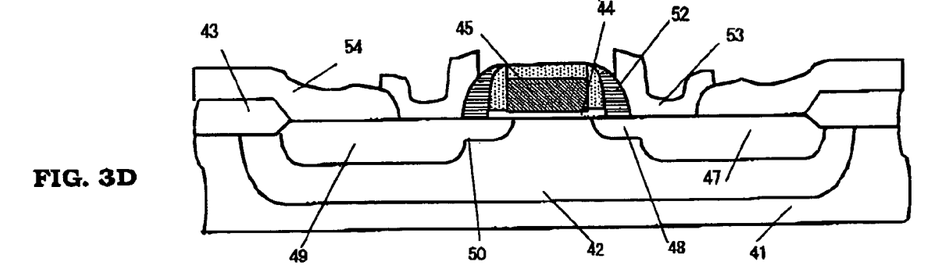

Next, in FIG. 3D, the interlayer insulating film 54 is deposited to a film thickness in the range of 200 nm to 800 nm. Subsequently, contact holes are formed for connecting wiring to each of the source region and the drain region. The contact holes are formed such that each of the contact holes each partially overlaps the polycrystalline silicon side spacer 52. It is preferable that each of the contact holes overlaps the silicon side spacer 52 for a length of 0.2 μm to 1.0 μm. After that, wiring metal is formed through sputtering and subjected to patterning so as to connect to the drain surface through one of the contact holes, while at the same time the polycrystalline silicon side spacer 52 on the low impurity concentration drain region 48 is connected to drain electrode metal 53. The distance between the polycrystalline silicon gate 45 and the drain electrode metal 53 is uniquely defined according to the film thickness of the polycrystalline silicon side spacer 52, which eliminates the need to give consideration for providing a margin for possible variation in thickness, and therefore, the element can be designed in minimal dimensions and minimized in size. It should be noted that the polycrystalline silicon side spacer 52 and the drain electrode metal 53 are not necessarily connected to each other. The decision as to whether or not to connect the polycrystalline silicon side spacer 52 and the drain electrode metal 53 to each other can be made in consideration of desired electric characteristics, a transistor size, etc.

FIGS. 4A to 4D are schematic cross-sectional diagrams showing sequential process steps according to a fourth embodiment of a manufacturing method for a semiconductor device of the present invention.

Figure 4A:
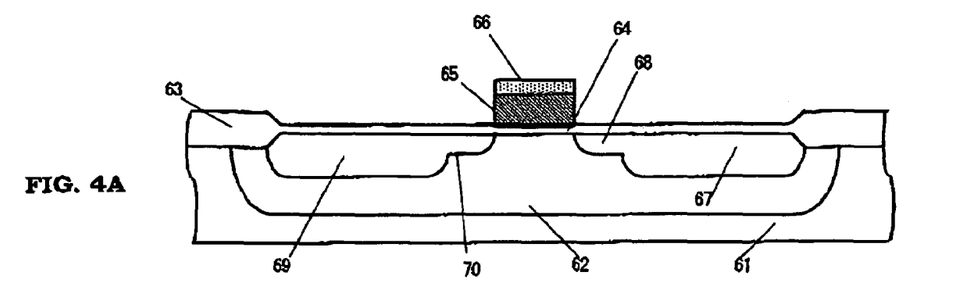
FIGS. 4A to 4D are schematic cross-sectional diagrams showing process steps of a manufacturing method for a semiconductor device in sequence according to a fourth embodiment of the present invention.

In FIG. 4A, a P-type semiconductor substrate 61 for example, doped with boron at an impurity concentration to attain a resistivity of 20 Ωcm to 30 Ωcm, is subjected to, for example, ion implantation of boron at a dose of $1 \times 10^{11}$ atoms/cm$^2$ to $1 \times 10^{13}$ atoms/cm$^2$ and to annealing at 1,000 to 1,200° C. for several hours to ten-odd hours, to form a diffusion layer or a P-type well 62. Here, an explanation is given on process steps for forming a P-type well on a P-type semiconductor substrate, while a P-type well may also be formed on an N-type semiconductor substrate in a similar manner. The substrate can have either conductivity type, which is irrelevant to the gist of the present invention.

Then, a field insulating film 63, for example, a thermal oxide film of a thickness of several thousands Å to 1 μm, is formed on the substrate by a LOCOS method, and a part of the insulating film corresponding to a region for forming a MOS transistor is removed, to thereby form a gate insulating film 64, for example, a thermal oxide film of a thickness of 5 nm to 100 nm. The P-type semiconductor substrate 61 and P-type well 62 are subjected to ion plantation before or after the formation of the gate insulating film 64 to thereby control the impurity concentrations thereof. Subsequently, polycrystalline silicon is deposited on the gate insulating film 64, and impurities are introduced through predeposition or ion implantation. Further, a silicon nitride film is deposited and subjected to patterning, to thereby obtain a silicon nitride film 66 for a gate electrode. Here, the polycrystalline silicon preferably has a thickness of 100 nm to 500 nm, and the silicon nitride film 66 preferably has a thickness of 30 nm to 100 nm. Also, a silicide layer such as WSi may be deposited between the polycrystalline silicon film and the silicon nitride film 66.

After that, the polycrystalline silicon is subjected to patterning by using the silicon nitride film 66 for the gate electrode as a mask, to thereby obtain a polycrystalline silicon gate 65 which serves as a gate electrode.

Subsequently, for example, arsenic (As) ions are implanted at a dose of, preferably, $1\times10^{14}$ to $1\times10^{16}$ atoms/cm$^2$ so as to reduce a sheet resistance, to form a high impurity concentration drain region 67 and a high impurity concentration source region 69 each at a certain distance from the polycrystalline silicon gate 45. After that, for example, phosphorus ions are implanted at a dose of, preferably, $1\times10^{12}$ to $1\times10^{14}$ atoms/cm$^2$, to form a low impurity concentration drain region 68 and a low impurity concentration source region 70 in a self alignment manner by using each of the polycrystalline silicon gate 65 and the silicon nitride film 66 as a mask.

Figure 4B:
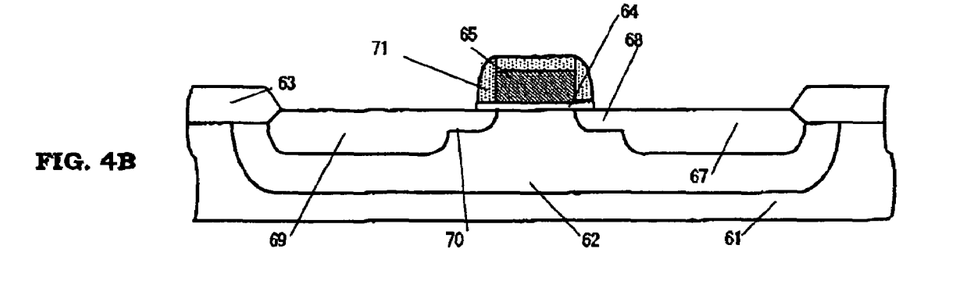

In FIG. 4B, a silicon nitride film is deposited again, and subjected to anisotropic etching, to thereby form a silicon nitride film side spacer 71. The film thickness of each of the polycrystalline silicon gate 65, the silicon nitride film 66 on the gate electrode, and the silicon nitride film constituting the side spacer may be controlled, to thereby change the silicon nitride film side spacer 71 to have various widths in a lateral direction. The silicon nitride film preferably has a film thickness of 100 nm to 500 nm, with a width of 0.1 μm 0.5 μm in a lateral direction.

Figure 4C:
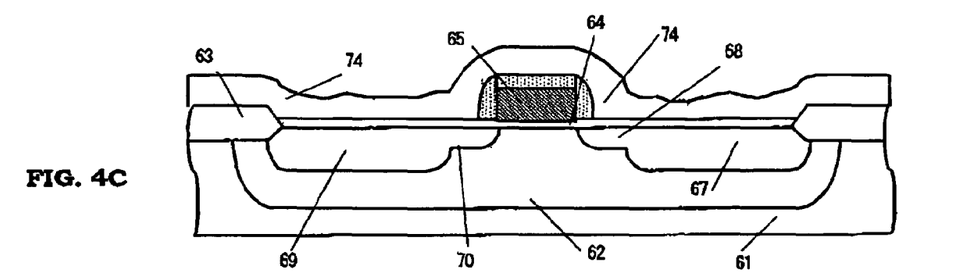

Next, in FIG. 4C, the interlayer insulating film 74 is deposited to a film thickness in the range of 200 nm to 800 nm over the entire surface.

Figure 4D:
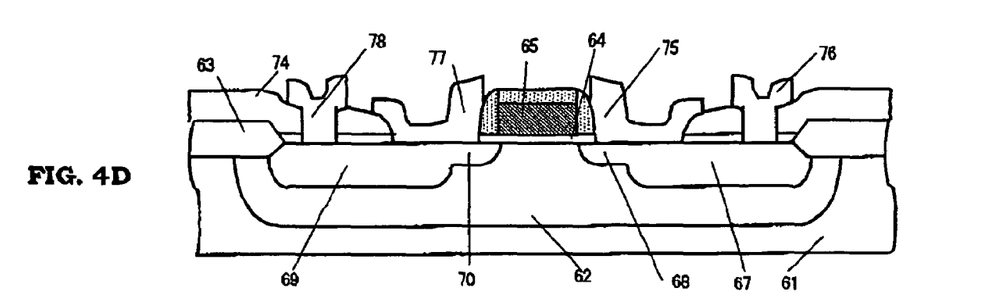

Subsequently, in FIG. 4D, a contact hole is formed on each of the low impurity concentration regions and high impurity concentration regions of the source and the drain. After that, metal such as Al—Si—Cu is formed through sputtering and subjected to patterning. Then, the surfaces of the source and the drain are connected to a metal layer of Al—Si—Cu through the contact holes, to thereby form a high impurity concentration region drain electrode 76, a low impurity concentration region drain electrode 75, a high impurity concentration region source electrode 78, and a low impurity concentration region source electrode 77. It should be noted that the contact hole and the metal layer are not necessarily formed on the low impurity concentration source region.

FIGS. 5A to 5E are schematic cross-sectional diagrams showing process steps in sequence according to a fifth embodiment of a manufacturing method for a semiconductor device of the present invention.

Figure 5A:
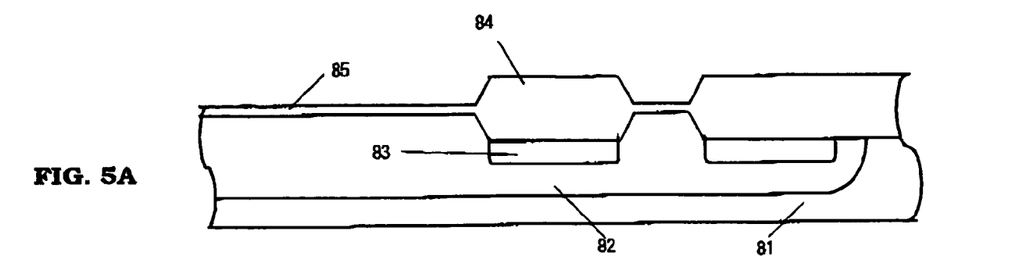
FIGS. 5A to 5E are schematic cross-sectional diagrams showing process steps of a manufacturing method for a semiconductor device in sequence according to a fifth embodiment of the present invention.

In FIG. 5A, a P-type semiconductor substrate 81, for example, a semiconductor substrate doped with boron at an impurity concentration to attain a resistivity of 20 Ωcm to 30 Ωcm, is subjected to, for example, ion implantation of boron at a dose of $1\times10^{11}$ atoms/cm$^2$ to $1\times10^{13}$ atoms/cm$^2$ and to annealing at 1,000 to 1,200° C. for several hours to ten-odd hours, to thereby have a diffusion layer or a F-type well 82 formed thereon. Here, an explanation is given on process steps for forming a P-type well on a P-type semiconductor substrate, while a P-type well may also be formed on an N-type semiconductor substrate in a similar manner. The substrate may assume either conductivity type, which is irrelevant to the gist of the present invention.

Then, a thick oxide film is formed on the substrate by a LOCOS method. Following the deposition and patterning of a silicon nitride film (not shown), impurities such as phosphorus are ion implanted at a dose of $1\times10^{11}$ to $1\times10^{13}$ atoms/cm$^2$, to form a thick oxide film, for example, a thermal oxide film with a thickness of 0.2 μm to 2 μm. Through those process steps, a low impurity concentration drain region 83 is formed below the thick oxide film 84. After that, a gate insulating film 85 is further formed.

Figure 5B:
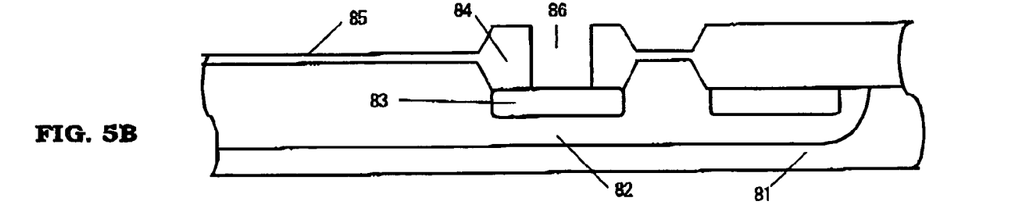

After that, as shown in FIG. 5B, the thick oxide film 84 is partially removed through etching, to thereby open a low impurity concentration drain region window 86. A surface of the low impurity concentration drain region 83 is exposed through anisotropic etching, or a combination of anisotropic etching and isotropic etching as two stages. The distance between the low impurity concentration drain region window 86 and the gate insulating film 85, which is a thin oxide film, is determined in consideration of desired electric characteristics, such as a resistance.

Figure 5C:
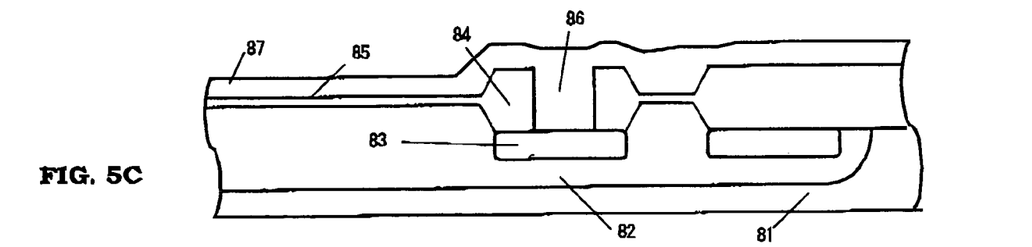

Subsequently, as shown in FIG. 5C, polycrystalline silicon 87 is deposited, to which impurities are introduced through predeposition or ion implantation.

Figure 5D:
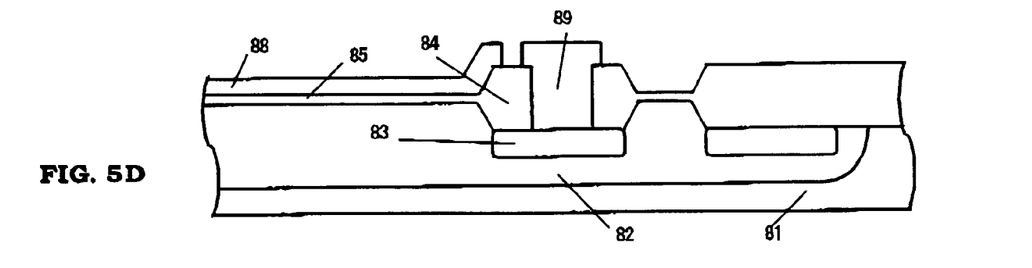

Then, as shown in FIG. 5D, the polycrystalline silicon 87 is subjected to patterning, to thereby obtain a polycrystalline silicon gate 88, which serves as a gate electrode, and a polycrystalline silicon drain region 89 on the low impurity concentration drain region.

Figure 5E:
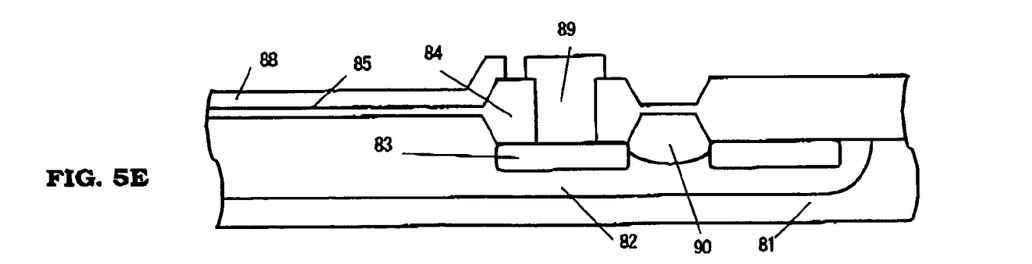

Next, as shown in FIG. 5E, in order to form a high impurity concentration source region (not shown) and a high impurity concentration drain regions 90, for example, arsenic (As) is ion implanted at a concentration of, preferably, $1\times10^{14}$ to $1\times10^{16}$ atoms/cm$^2$ so as to reduce a sheet resistance. After that, a process for carrying out wiring is performed, in which an electrode connected to the high impurity concentration drain region 90 may or may not be connected to the polycrystalline silicon drain region 89. Considerations may be given to a desired transistor resistance, an ESD immunity, and driving performance, to carry out the optimal wiring.

FIGS. 6A to 6E are schematic cross-sectional diagrams showing process steps in sequence according to a sixth embodiment of a manufacturing method for a semiconductor device of the present invention.

Figure 6A:
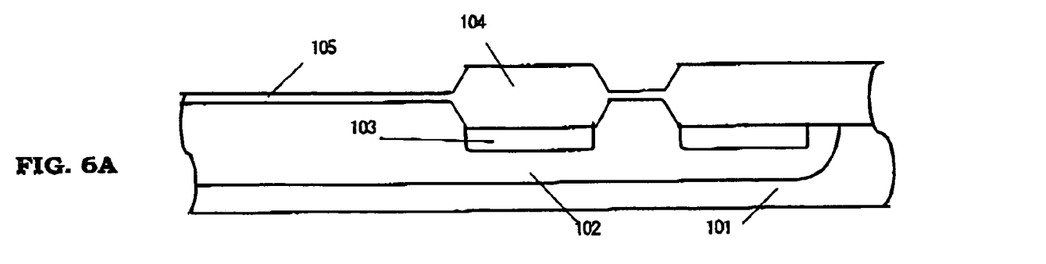
FIGS. 6A to 6E are schematic cross-sectional diagrams showing process steps of a manufacturing method for a semiconductor device in sequence according to a sixth embodiment of the present invention.

In FIG. 6A, a P-type semiconductor substrate 101, for example, a semiconductor substrate doped with boron at an impurity concentration to attain a resistivity of 20 Ωcm to 30 Ωcm, is subjected to, for example, ion implantation of boron at a dose of $1\times10^{11}$ atoms/cm$^2$ to $1\times10^{13}$ atoms/cm$^2$ and to annealing at 1,000 to 1,200° C. for several hours to ten-odd hours, to thereby have a diffusion layer or a P-type well 102 formed thereon. Here, an explanation is given on process steps for forming a P-type well on a P-type semiconductor substrate, while a P-type well may also be formed on an N-type semiconductor substrate in a similar manner. The substrate may assume either conductivity type, which is irrelevant to the gist of the present invention.

Then, a thick oxide film is formed on the substrate by a LOCOS method. Following the deposition and patterning of a silicon nitride film (not shown), impurities such as phosphorus are ion implanted at a dose of, preferably, $1\times10^{11}$ to $1\times10^{13}$ atoms/cm$^2$, to form a thick oxide film, for example, a thermal oxide film with a thickness of 0.2 μm to 2 μm. Through those process steps, a low impurity concentration drain region 103 is formed below the thick oxide film 104. After that, a gate insulating film 105 is further formed.

Figure 6B:
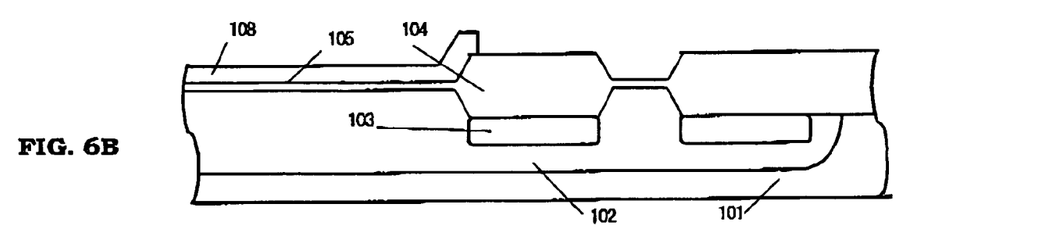

Subsequently, as shown in FIG. 6B, polycrystalline silicon 107 is deposited, to which impurities are introduced through predeposition or ion implantation. Then, the polycrystalline silicon 107 is subjected to patterning, to thereby obtain a polycrystalline silicon gate 108 which serves as a gate electrode.

Figure 6C:
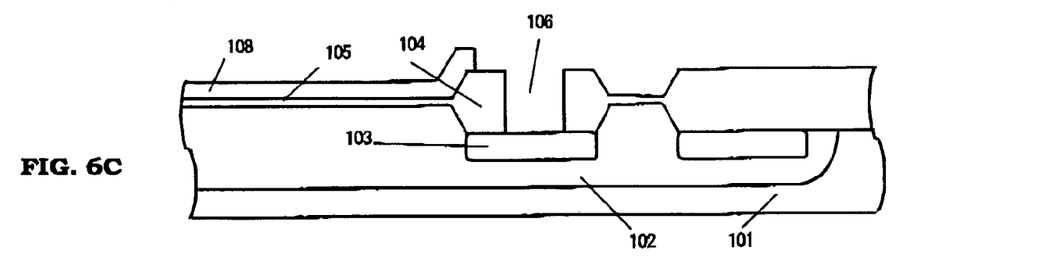

After that, as shown in FIG. 6C, the thick oxide film 104 is partially removed through etching, to thereby form a low impurity concentration drain region window 106. A surface of the low impurity concentration drain region 103 is exposed through anisotropic etching, or a combination of anisotropic etching and isotropic etching as two stages. The distance between the low impurity concentration drain region window 106 and the gate insulating film 105 which is a thin oxide film, is determined in consideration of desired electric characteristics such as a resistance.

Figure 6D:
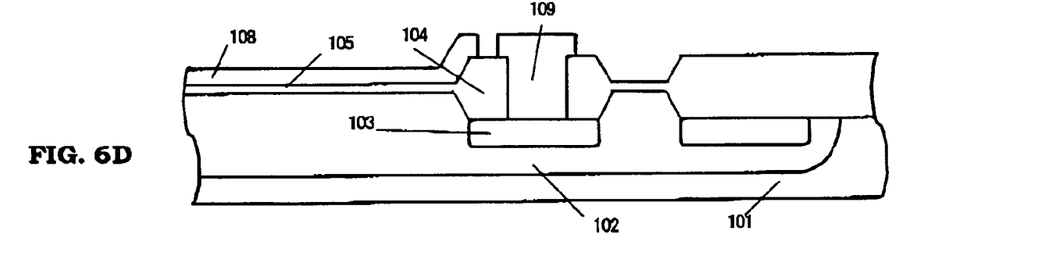

Next, in FIG. 6D, the polycrystalline silicon 107 is subjected to patterning, to thereby obtain a polycrystalline silicon drain region 109 on the low impurity concentration drain region.

Figure 6E:
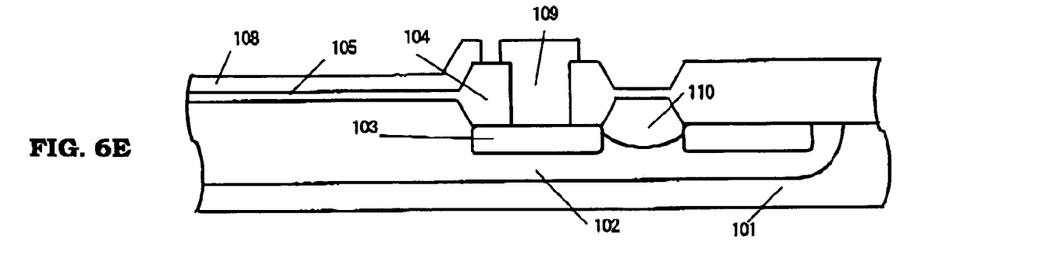

Subsequently, as shown in FIG. 6E, in order to form a high impurity concentration source region (not shown) and a high impurity concentration drain regions 110, for example, arsenic (As) is ion implanted at a dose of, preferably, $1\times10^{14}$ to $1\times10^{16}$ atoms/cm$^2$ so as to reduce a sheet resistance. After that, a process for carrying out wiring is performed, in which an electrode connected to the high impurity concentration drain region 110 may or may not be connected to the polycrystalline silicon drain region 109. Considerations may be given to a desired transistor resistance, an ESD immunity, and driving performance, to carry out the optimal wiring.

FIGS. 7A to 7E are schematic cross-sectional diagrams showing process steps in sequence according to a seventh embodiment of a manufacturing method for a semiconductor device of the present invention.

Figure 7A:
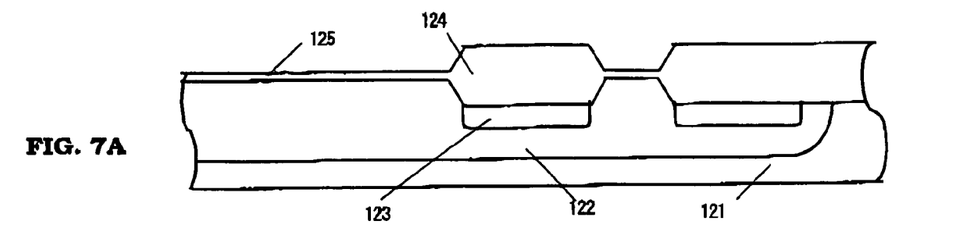
FIGS. 7A to 7E are schematic cross-sectional diagrams showing process steps of a manufacturing method for a semiconductor device in sequence according to a first embodiment of the present invention.

In FIG. 7A, a P-type semiconductor substrate 121, for example, a semiconductor substrate doped with boron at an impurity concentration to attain a resistivity of 20 Ωcm to 30 Ωcm, is subjected to, for example, ion implantation of boron at a dose of $1\times10^{11}$ atoms/cm$^2$ to $1\times10^{13}$ atoms/cm$^2$ and to annealing at, 1,000 to 1,200° C. for several hours to ten-odd hours, to thereby have a diffusion layer or a P-type well 122 formed thereon. Here, an explanation is given on process steps for forming a P-type well on a P-type semiconductor substrate, while a P-type well may also be formed on an N-type semiconductor substrate in a similar manner. The substrate may assume either conductivity type, which is irrelevant to the gist of the present invention.

Then, a thick oxide film is formed on the substrate by a LOCOS method. Following the deposition and patterning of a silicon nitride film (not shown), impurities such as phosphorus are ion implanted at a dose of, preferably, $1\times10^{11}$ to $1\times10^{13}$ atoms/cm$^2$, to form a thick oxide film, for example, a thermal oxide film with a thickness of 0.2 μm to 2 μm. Through those process steps, a low impurity concentration drain region 123 is formed below the thick oxide film 124. After that, a gate insulating film 125 is further formed.

Figure 7B:
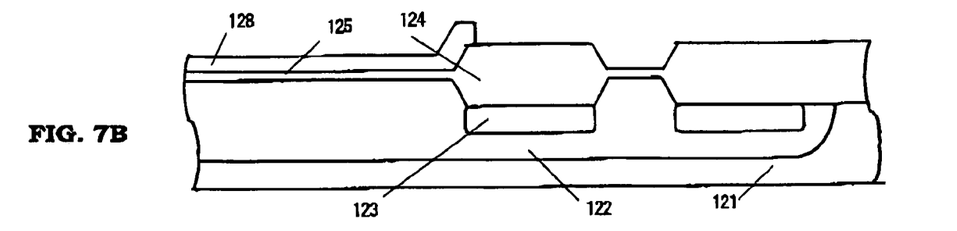

Subsequently, as shown in FIG. 7B, polycrystalline silicon 127 is deposited, to which impurities are introduced through predeposition or ion implantation. Then, the polycrystalline silicon 127 is subjected to patterning, to thereby obtain a polycrystalline silicon gate 128 which serves as a gate electrode.

Figure 7C:
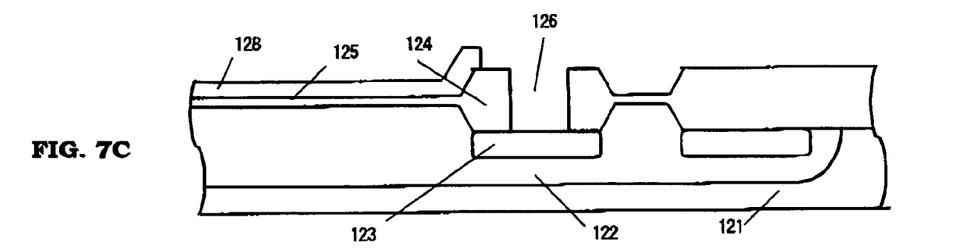

After that, as shown in FIG. 7C, the thick oxide film 124 is partially removed through etching, to thereby open a low impurity concentration drain region window 126. A surface of the low impurity concentration drain region 123 is exposed through anisotropic etching, or a combination of anisotropic etching and isotropic etching as two stages. The distance between the low impurity concentration drain region window 126 and the gate insulating film 125 which is a thin oxide film, is determined in consideration of desired electric characteristics, such as an ESD immunity, or a transistor resistance.

Figure 7D:
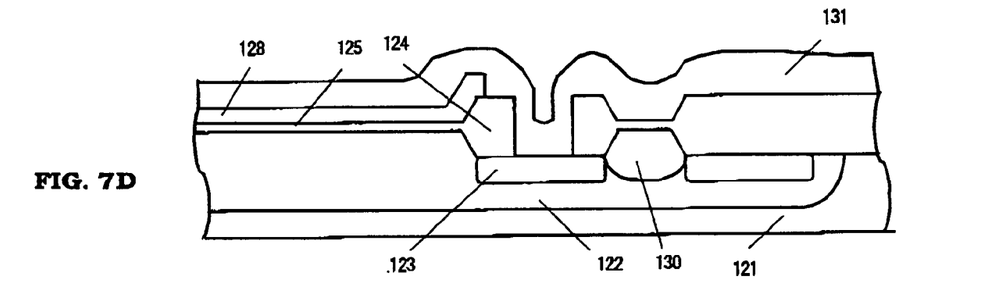

Subsequently, as shown in FIG. 7D, in order to form a high impurity concentration source region (not shown) and a high impurity concentration drain regions 130, for example, arsenic (As) is ion implanted at a dose of, preferably, $1\times10^{14}$ to $1\times10^{16}$ atoms/cm$^2$ so as to reduce a sheet resistance. After that, an interlayer insulating film 131 is deposited.

Figure 7E:
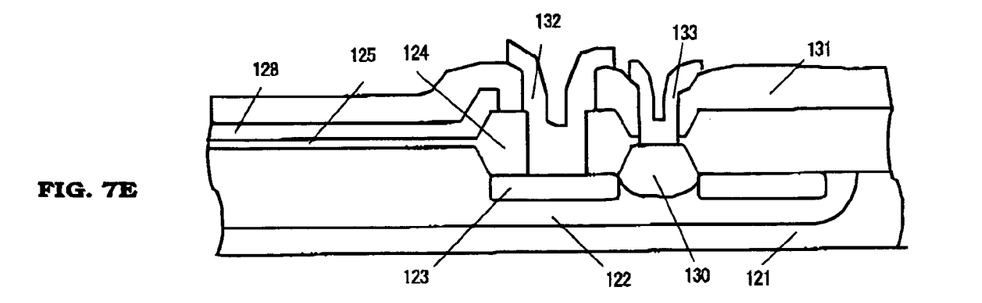

Subsequently, as shown in FIG. 7E, the interlayer insulating film 131 is subjected to patterning, to thereby expose surfaces of the low impurity concentration drain region 123 and the high impurity concentration drain region 130. After that, a metal layer or example, Al—Si—Cu, is deposited and subjected to patterning, hereby obtain a low impurity concentration, region metal layer and a high impurity concentration drain region electrode 133.

What is claimed is:

1. A manufacturing method for a semiconductor device, comprising the steps of:
    forming a gate insulating film on a semiconductor substrate layer of a first conductivity type;
    forming a gate electrode by depositing a first polycrystalline silicon on the gate insulating film, introducing impurities to the first polycrystalline silicon, and thereafter patterning the first polycrystalline silicon;
    forming a first impurity diffusion layer for a low impurity concentration drain of a second conductivity type within the semiconductor layer of the first conductivity type;
    forming a second impurity diffusion layer for a high impurity concentration drain of the second conductivity type adjacent to the first impurity diffusion layer, the second impurity diffusion layer having a higher impurity concentration than the first impurity diffusion layer;
    forming an interlayer insulating film on the semiconductor substrate layer;
    forming a drain extension region having a high thermal conductivity on a surface of the first impurity diffusion layer;
    forming a contact hole through the interlayer insulating film and up to the second impurity diffusion layer; and
    depositing a wiring metal layer into the contact hole to form therein a drain electrode that is electrically connected to the second impurity diffusion layer and that is disposed apart from and not in contact with the drain extension region.

2. A manufacturing method for a semiconductor device, comprising the steps of:
    forming a gate insulating film on a semiconductor substrate layer of a first conductivity type;
    forming a gate electrode on the gate insulating film;
    forming a first impurity diffusion layer to provide a low impurity concentration drain of a second conductivity type within the semiconductor substrate layer;
    forming adjacent to the first impurity diffusion layer a second impurity diffusion layer to provide a high impurity concentration drain of the second conductivity type, the second impurity diffusion layer having a higher impurity concentration than the first impurity diffusion layer;

forming an interlayer insulating film on the semiconductor substrate layer and at least over the low impurity concentration drain;

removing a part of the interlayer insulating film formed over the low impurity concentration drain;

depositing polycrystalline silicon on the low impurity concentration drain and the interlayer insulating film;

introducing impurities of the second conductivity type to the polycrystalline silicon;

forming a polycrystalline silicon drain extension using the polycrystalline silicon on a region where the part of the interlayer insulating film over the low impurity concentration drain has been removed;

forming a contact hole through the interlayer insulating film and up to the high impurity concentration drain; and depositing a wiring metal layer into the contact hole to form therein a drain electrode that is electrically connected to the high impurity concentration drain and that is disposed apart from and not in contact with the polycrystalline silicon drain extension.

3. A manufacturing method for a semiconductor device according to claim 2; wherein the semiconductor substrate layer is formed on a semiconductor substrate of the second conductivity type.

4. A manufacturing method for a semiconductor device according to claim 2; wherein the polycrystalline silicon has a film thickness within a range of 50 nm to 800 nm.

5. A manufacturing method for a semiconductor device according to claim 2; wherein the step of introducing impurities to the polycrystalline silicon comprises introducing impurities using an ion implantation method.

6. A manufacturing method for a semiconductor device, comprising the steps of:

forming a gate insulating film on a semiconductor substrate layer of a first conductivity type;

depositing polycrystalline silicon on the gate insulating film and introducing impurities to the polycrystalline silicon;

depositing a silicon nitride film on the polycrystalline silicon and subjecting the silicon nitride film to patterning;

forming a gate electrode by subjecting the polycrystalline silicon to patterning using the silicon nitride film as a mask;

forming an impurity diffusion layer of a second conductivity type within the semiconductor substrate layer, the impurity diffusion layer having a low impurity concentration drain an a high impurity concentration drain;

forming a first side spacer on a side wall of the gate electrode, the first side spacer being formed of the silicon nitride film;

forming a second side spacer on the first side spacer, the second side spacer being formed of polycrystalline silicon;

forming an interlayer insulating film on the semiconductor substrate layer and the impurity diffusion layer;

removing a part of the interlayer insulating film formed over the impurity diffusion layer;

forming a polycrystalline silicon drain extension on a region where the part of the interlayer insulating film has been removed;

forming a contact hole by removing a part of the interlayer insulating film corresponding to the high impurity concentration drain of the impurity diffusion layer; and depositing a wiring metal layer into the contact hole to form therein a drain electrode that is electrically connected to the high impurity concentration drain of the impurity diffusion layer and that is disposed apart from and not in contact with the low impurity concentration drain of the impurity diffusion layer.

7. A manufacturing method for a semiconductor device according to claim 6; further comprising the step of electrically connecting the second side spacer to the wiring metal simultaneously with the step of depositing the wiring metal and electrically connecting the wiring metal to the high impurity concentration drain of the impurity diffusion layer.

8. manufacturing method for a semiconductor device according to claim 6; wherein the semiconductor substrate layer is formed on a semiconductor substrate of the second conductivity type.

9. A manufacturing method for a semiconductor device according to claim 6; wherein the first side spacer has a width within a range of 0.1 µm to 0.5 µm.

10. A manufacturing method for a semiconductor device according to claim 6; wherein the second side spacer has a width within a range of 0.2 µm to 1.0 µm.

11. A manufacturing method for a semiconductor device according to claim 6; further comprising the step of introducing impurities to the second side spacer by ion implantation method.

* * * * *